(12) United States Patent
Sowden et al.

(10) Patent No.: US 9,401,299 B2
(45) Date of Patent: Jul. 26, 2016

(54) SUPPORT FOR SEMICONDUCTOR SUBSTRATE

(75) Inventors: Ralph Sowden, Minneapolis, MN (US); Kevin Barr, Inver Grove Heights, MN (US); Matthew Laberge, Plymouth, MN (US); Troy Palm, Eden Prairie, MN (US); Dennis Benson, Burnsville, MN (US)

(73) Assignee: Rudolph Technologies, Inc., Wilmington, MA (US)

( * ) Notice: Subject to any disclaimer, the term of this patent is extended or adjusted under 35 U.S.C. 154(b) by 794 days.

(21) Appl. No.: 13/825,769

(22) PCT Filed: Sep. 26, 2011

(86) PCT No.: PCT/US2011/053263
§ 371 (c)(1),
(2), (4) Date: Jun. 14, 2013

(87) PCT Pub. No.: WO2012/040705
PCT Pub. Date: Mar. 29, 2012

(65) Prior Publication Data
US 2013/0330154 A1 Dec. 12, 2013

Related U.S. Application Data

(60) Provisional application No. 61/386,271, filed on Sep. 24, 2010.

(51) Int. Cl.
*H01L 21/683* (2006.01)
*H01L 21/67* (2006.01)
*H01L 21/68* (2006.01)
*H01L 21/687* (2006.01)

(52) U.S. Cl.
CPC ...... *H01L 21/6838* (2013.01); *H01L 21/67253* (2013.01); *H01L 21/67259* (2013.01); *H01L 21/68* (2013.01); *H01L 21/68785* (2013.01)

(58) Field of Classification Search
CPC  B25B 11/007; B25B 11/005; B23Q 2703/04; B23B 31/307
See application file for complete search history.

(56) References Cited

U.S. PATENT DOCUMENTS

| | | | | |
|---|---|---|---|---|
| 4,409,860 A | * | 10/1983 | Moriyama | B23Q 1/621 108/143 |
| 4,766,465 A | * | 8/1988 | Takahashi | B23Q 1/26 148/DIG. 102 |
| 4,896,869 A | * | 1/1990 | Takekoshi | B23Q 19/04 269/309 |
| 4,932,358 A | | 6/1990 | Studley et al. | |
| 5,022,619 A | * | 6/1991 | Mamada | H01L 21/68 248/187.1 |
| 6,137,303 A | | 10/2000 | Deckert et al. | |
| 7,292,427 B1 | | 11/2007 | Murdoch et al. | |

(Continued)

OTHER PUBLICATIONS

Notification of Transmittal of the International Search Report and the Written Opinion of the International Searching Authority, or the Declaration (PCT/US11/53263) mailed Apr. 5, 2012 (16 pages).

*Primary Examiner* — Lee D Wilson
(74) *Attorney, Agent, or Firm* — Dicke, Billig & Czaja, PLLC

(57) ABSTRACT

A moveable semiconductor substrate support includes a control device receiving data from one or more sensors and providing control signals to one or more actuators. The control device is coupled to and moves with the moveable substrate support to facilitate flexible and complex operation of the substrate support itself.

20 Claims, 8 Drawing Sheets

(56) References Cited

U.S. PATENT DOCUMENTS

| | | |
|---|---|---|
| 7,452,793 B2 | 11/2008 | Kaushal et al. |
| 7,959,141 B2 * | 6/2011 | Makino .................. G03B 27/62 269/58 |
| 2006/0062897 A1 * | 3/2006 | Gu ....................... C23C 18/1632 427/8 |
| 2009/0045182 A1 | 2/2009 | Lerner et al. |
| 2009/0218510 A1 * | 9/2009 | Fujita ...................... H01J 37/20 250/443.1 |
| 2010/0283986 A1 * | 11/2010 | Shibazaki ........... G03F 7/70716 355/72 |
| 2013/0330154 A1 * | 12/2013 | Sowden ............ H01L 21/67253 414/222.02 |

* cited by examiner

SUPPORT FOR SEMICONDUCTOR SUBSTRATE

CROSS-REFERENCE TO RELATED APPLICATION

This application is U.S. national stage application claiming priority under 35 U.S.C. §371 to International Application Serial No. PCT/US11/53263, filed on Sep. 26, 2011, which claims the benefit of U.S. Provisional Patent Application Ser. No. 61/386,271 filed on Sep. 24, 2010; the teachings of all of which are incorporated herein by reference.

TECHNICAL FIELD OF THE INVENTION

The present invention relates generally to semiconductor substrate handling and more specifically to a support for semiconductor substrate inspection, metrology and processing.

BACKGROUND OF THE INVENTION

It is known to use controllers such as PLCs (programmable logic controllers) to control the movement and position of mechanical devices. Typically, such controllers are used with mechanisms that are relatively stationary, that is, they do not move relative to the position of the controller beyond a certain very limited range. Where relative motion and/or rotation exceeds a certain limited range, it can be difficult to provide the required power and communication connections to or between a controller and a control device or mechanism.

In the semiconductor device manufacturing field, it is known to be difficult to provide reliable power and communication connections between a controller and a wafer support or top plate used to support a semiconductor substrate such as a wafer during manufacture or inspection. This is as a result of rapid and relatively large translations in an XY plane which is compounded by the fact that such semiconductor substrate supports may be required to rotate in excess of 180°. Such physical constraints require complicated and somewhat unreliable connections and/or require a great deal of simplification in the mechanical functions that may be carried out at or by a semiconductor substrate support. Accordingly, there is a need for an improved means for providing improved control input to devices operating on or in conjunction with a semiconductor substrate support.

SUMMARY

A semiconductor substrate support is herein disclosed. In some embodiments, the substrate support includes a vacuum system coupled with a top plate that supports a semiconductor substrate. Moreover, in some embodiments, one or more control mechanisms are provided that move with the substrate support.

DETAILED DESCRIPTION

Figure 1:
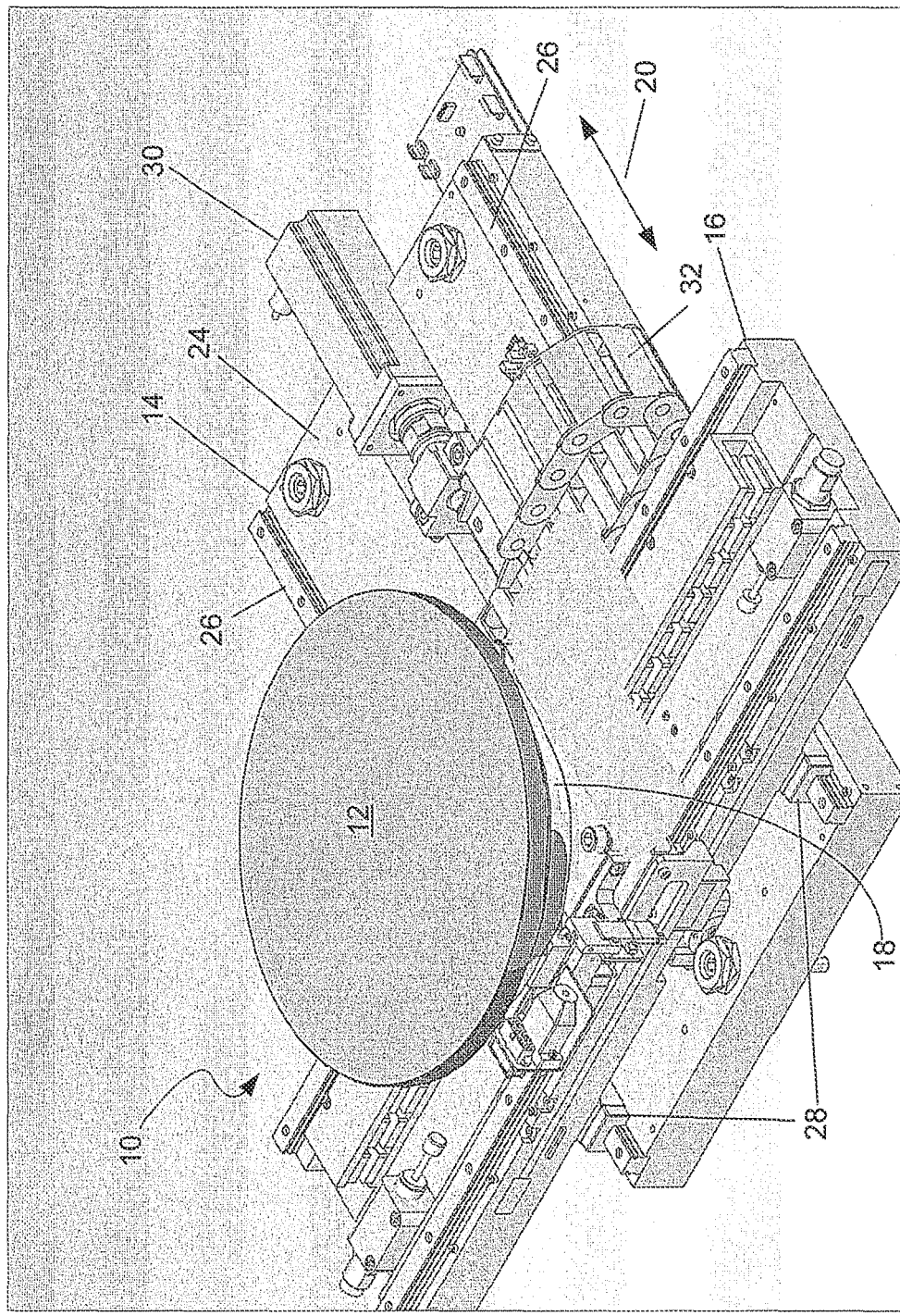
FIG. 1 is a perspective view of a typical semiconductor substrate support of the prior art.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a perspective view of a typical semiconductor substrate support 10 of the prior art. In general, a semiconductor substrate support 10 is adapted to position a top plate 12 in a desired position and orientation with respect to a processing or inspection mechanism (not shown). The prior art semiconductor substrate support 10 shown in FIG. 1 includes an X stage 14, a Y stage 16, and a rotary stage 18. Operation of stages 14-18 permits the flexible positioning and orientation of a semiconductor substrate (not shown) on the upper surface of the top plate 12 in an X, Y plane and around an axis normal to the X, Y plane.

In general, the X stage 14 and the Y stage 16 are arranged in an orthogonal relationship to one another such that the Y stage 16 is translated by the X stage 14 in an X direction 20. Similarly, the Y stage 16 supports the rotary stage 18 and translates it in a Y direction. As the X and Y stages 14, 16 typically similar in structure and function, only X stage 14 is described in any detail herein.

X stage 14 has a base 24 that is fixed to a chassis (not shown) of a semiconductor substrate processing or inspection device or system. The base 24 includes one or more rails 26 on which linear bearings 28 translate. Y stage 16 is mounted upon the linear bearings 28 for translation in the X direction as shown by arrow 20. An actuator 30 translates the Y stage 16 on linear bearings 28. A linear encoder (not shown) is coupled between the base 24 of the X stage 14 and the linear bearings 28 of the X stage 14 to indicate the position of the Y stage 16 in the X direction.

Power and control signals are fed to the actuator 30 from an external controller (not shown) that may be a personal computer or the like. These signals control the position of the Y stage 16 on the linear bearings 28 of the X stage 14. The Y stage 16 and the rotary stage 18 are controlled in a similar manner. Feedback from the various stages may be provided to the external controller to more accurately control the position of a semiconductor substrate secured to the top plate 12.

As the base 24 of the X stage 14 is essentially fixed and location, it is relatively simple to provide air, vacuum, power, and control connections to the actuator 30 and the position encoder. Providing the same connections to the Y stage 16 mounted upon the X stage 14 is more difficult and requires the use of cable and hose management systems such as the flexible conduit 32. Typically, a length of cable or hose is secured between the bases of the stages 14, 16. Slack in the length of cable or hose secured between the stages allows for the relative translation of the stages 14, 16. Flexible conduit 32 controls the position and the manner in which the slack cable or hosing is extended or retracted. In order to make the connection between a vacuum source that is external to the stage 10, it may be required that hosing is passed through at least one section of flexible conduit 32 to the rotary stage 18. To prevent binding of the connections to the top plate 12, it is common to provide a rotary coupling within the base of the rotary stage 18.

The difficulty in providing the proper power and control connections between external controllers and sources and the moving top plate of a semiconductor substrate support has limited user's abilities to provide fine control and/or data connections between a top plate and an external or system controller. According to one embodiment of the present invention shown in FIG. 2, a stage 50 is provided with a local controller 52 and a local air/vacuum controller 54 that move with a semiconductor substrate support. Dashed line 56 illustrates schematically the boundary between the stationary portions of a semiconductor substrate processing or inspection system and the movable portions of a stage 50. A rotary coupling 56 may be used to make connections between the controllers 52, 54 and the top plate 12.

The benefit of including the local controllers 52, 54 is the simplification of the control runs that must be made between the stationary in the movable portions of an inspection or processing system. For example, in older designs it was frequently necessary to provide individual connections to each device in a top plate 12 that required active control. Where complex functions were required, additional control connections were made or complex electrical, mechanical, or pneumatic systems susceptible of one bit were implemented. Local controllers 52, 54 simplified command and control of sensors, structures, and mechanisms located within, on, or adjacent to the top plate 12.

Figure 3:
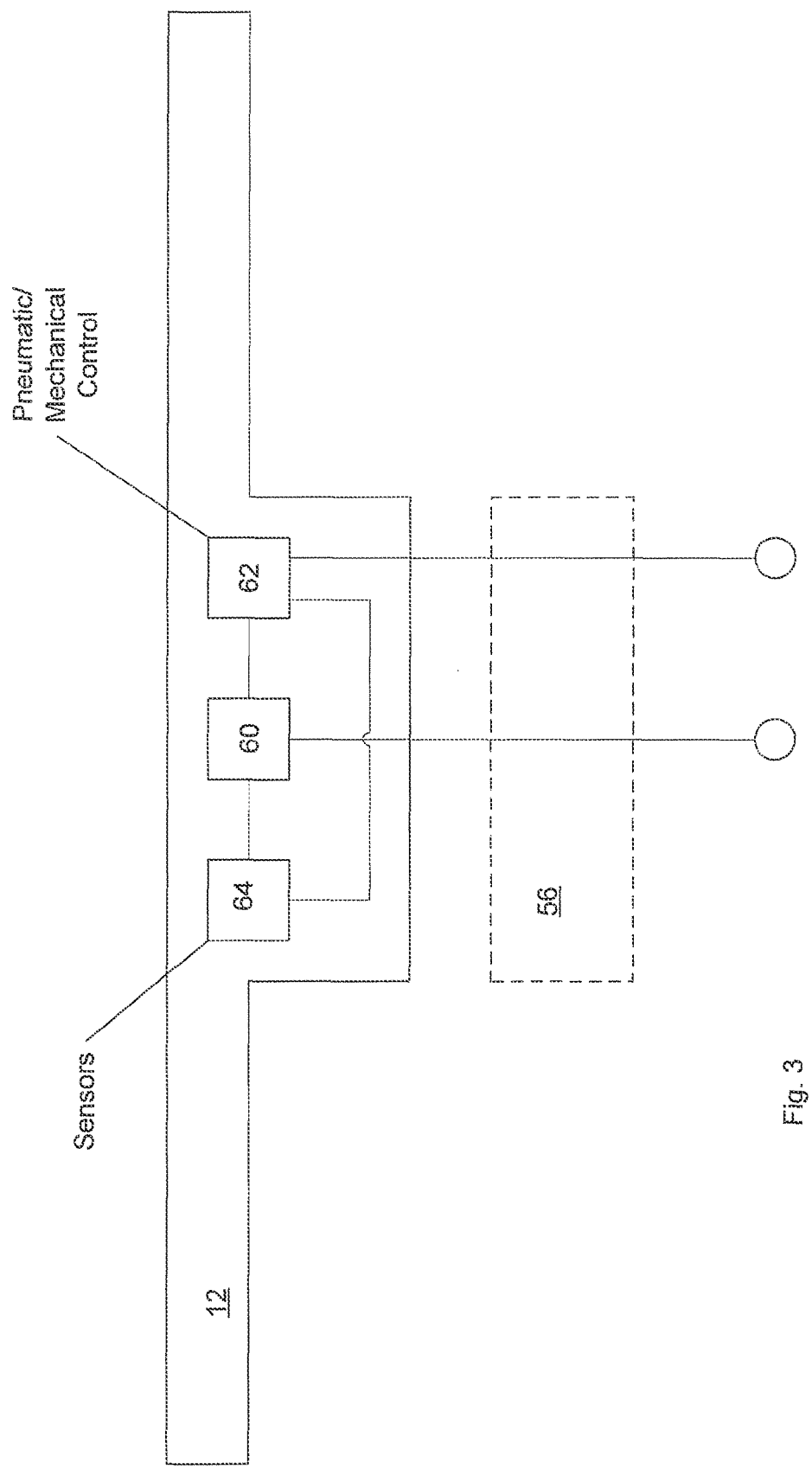
FIG. 3 is a schematic of a semiconductor substrate support according to an embodiment of the present invention.

FIG. 3 schematically illustrates an embodiment of the present invention in which a controller 60 is positioned within or adjacent to a top plate 12 itself such that a controller 60 rotates with the top plate 12. One or more additional controllers 62 may be provided to carry out additional functionality within the top plate 12. Note that the number, placement, nature, and function of one or more controllers 60, 62 is highly dependent upon the nature of the application to which the semiconductor substrate support or stage 50 is put. As seen in FIG. 3, controller 60 may be coupled to controller 62 and, where present, one or more sensors 64 within a top plate 12. Where the controller 60 is a simple input/output device, this controller may simply relay instructions from and provide data to a stationary and remote system controller (not shown). The controller 60 may facilitate communication between a second controller 62 and the sensors 64. The second controller 62 may receive control signals from the first controller 60 or, as indicated above, from a stationary and remote system controller (not shown).

Figure 2:
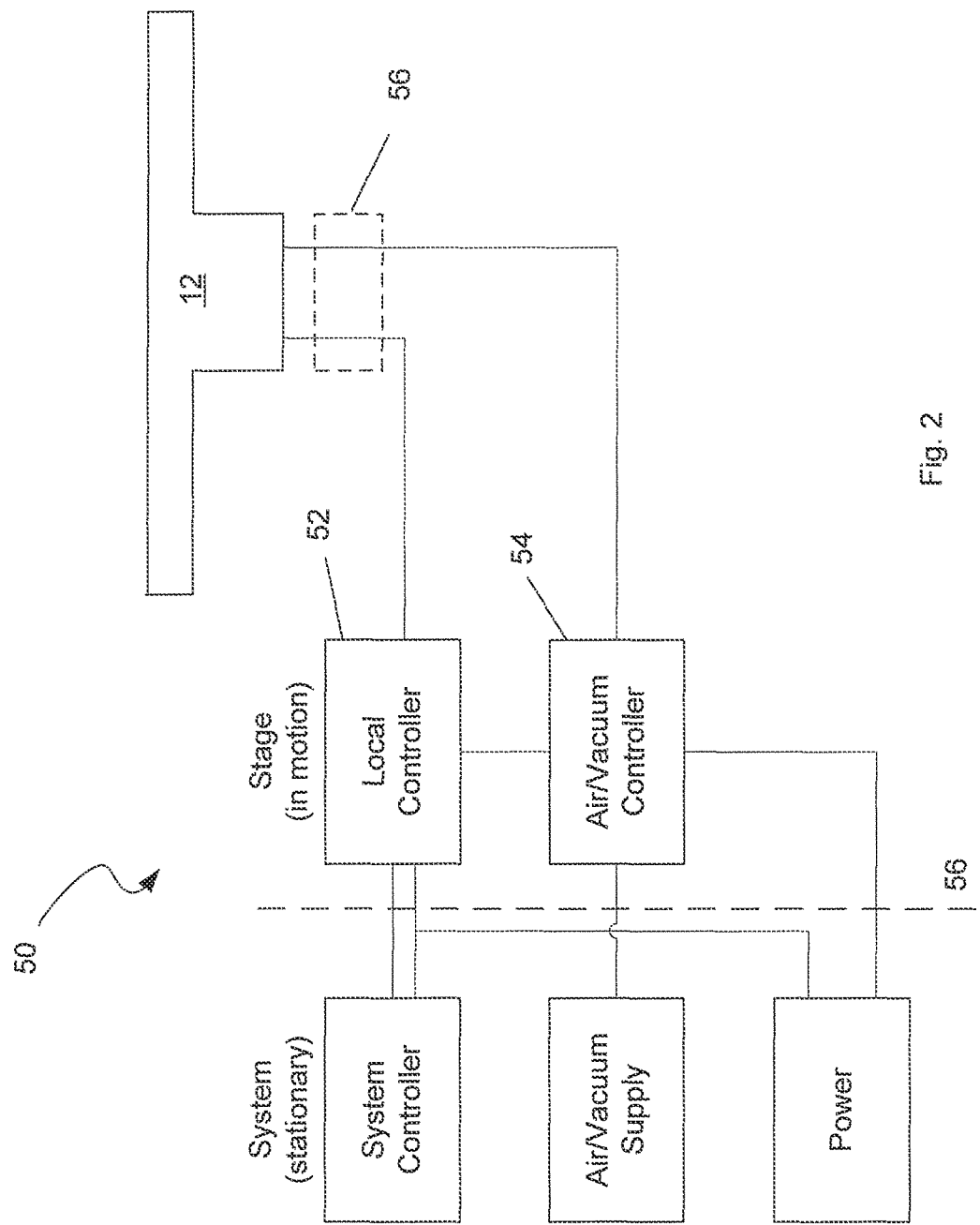
FIG. 2 is a schematic of a semiconductor substrate support according to an embodiment of the present invention.

In the embodiment of FIG. 3, it is envisioned that controller 60 receives input from either a local controller 52 as seen in FIG. 2 or from a stationary and remote system controller. In some embodiments, the controller 60 may obtain information from the sensors 64 and provide this information to a controller to which it is coupled. Commands based on the input obtained from the sensors 64 may be returned to the controller 60 which then relays commands to the second controller 62. In some embodiments, the second controller 62 is adapted to control a supply of high-pressure air or vacuum to the top plate 12. In other embodiments, the second controller 62 incorporates an actuator that controls some function of the top plate 12. For example, the controller 62 may be an electrically actuated pneumatic valve controller that controls the application of a vacuum to an upper surface of the top plate 12 for purpose of securing a semiconductor substrate thereto.

It is to be understood that in some embodiments, the controller 60 may be provided with some degree of logical function and/or memory. In some embodiments, the controller 60 may be a programmable logic controller (PLC) or an embedded controller. Alternatively, as indicated above, the controller 60 may be a simple input/output device. In one embodiment of the invention, the controller 60 is coupled to an external controller (not shown) by a single electrical connection that passes through the rotary coupling 56. Where only a single electrical connection exists between a controller 60 and the "external" controller, this connection will typically be used for communication. Power for the controller 60 may be provided by either a battery (not shown) or a capacitive or inductive power circuit of some useful configuration. However, it is more often the case that a controller will be connected to at least two electrical conductors. One such conductor can be used for indications purposes, and another can be used for the provision of power to the controller 60. A third conductor may be connected to the controller 60 to provide for a secure ground path. In some embodiments, wireless connectivity may be used to provide a connection between the controller 60 and an external controller such as controller 52 or a system controller that is stationary with respect to the entire system. Wireless approaches can also be used to provide connectivity to the controller 60, power for the controller 60, the sensors 64, and an additional controller 62 (if any). Alternatively, a battery, power circuit, or capacitive power circuit can suffice.

Figure 4:
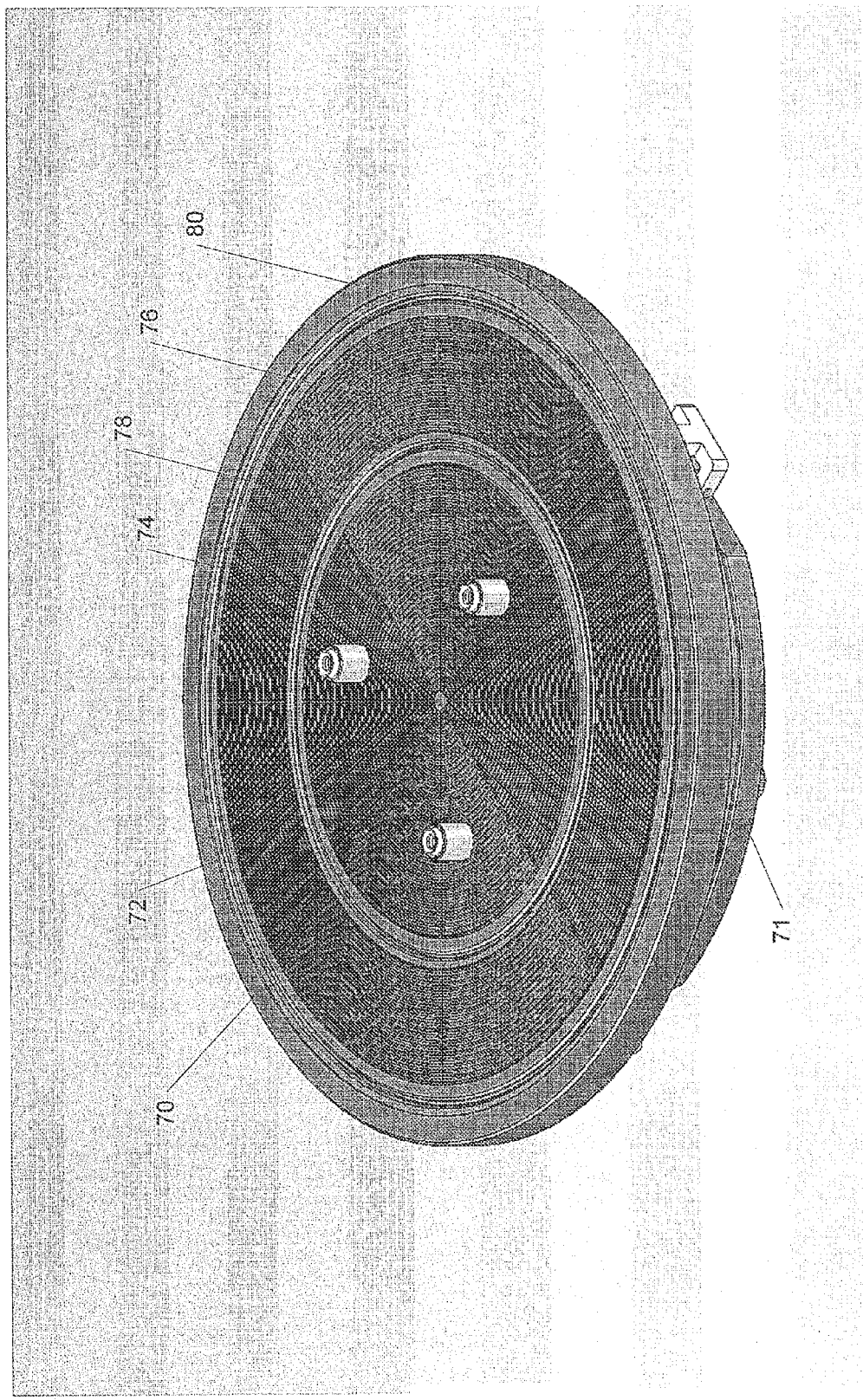
FIG. 4 is a perspective view of a top plate constructed and arranged according to an embodiment of the present invention.

The use of an on-board controller as described above greatly facilitates and simplifies the control of mechanisms such as those found in top plate 70 illustrated in FIG. 4. In a generic sense, a top plate such as top plate 70 exists simply to support a semiconductor substrates such as a wafer. By attaching the top plate 70 to a stage 71, the semiconductor substrate can be moved with respect to a processing or inspection system. Because of that the precise positioning requirements of the semiconductor fabrication process, it is important that a semiconductor substrate remain on a top plate in a known position. Further, it is imperative that the semiconductor substrate be flat to allow for processing or inspection. Top plate 70 is provided with a vacuum hold-down system to both secure a semiconductor substrate be upper surface of the top plate and to flatten the semiconductor substrate. Top plate 70 has an upper surface 72 that is machined to be exceedingly flat. Into this upper surface are formed series of interconnected grooves which are, in the embodiment illustrated in FIG. 4, divided into an inner 74 and an outer portion 76. The inner portion grooves 74 formed into the upper surface 72 of the top plate 70 is bounded by an inner seal 78. The outer portion of grooves 76 is positioned between the inner seal 78 and an outer seal 80. Each of the inner and outer portions of grooves 74, 76 are pneumatically coupled to a valve manifold positioned within the top plate 70. A valve manifold is itself coupled to a source of vacuum pressure. The valve manifold is controlled by a valve controller also positioned within the top plate 70. The valve controller is coupled to an I/O controller within the top plate 70 which provides control signals from a stationary system controller or from a local controller mounted on the Y stage as described above. The valve manifold is operated by the I/O controller to selectively coupled to the inner and outer portions of grooves 74, 76 to the vacuum source. Coupling just the inner portion of grooves 74 to the vacuum source allows an operator of the system to secure a relatively small semiconductor substrate, one that is roughly the size of the inner seal 78, to the top plate 70. In this instance, there is no need to connect the outer portion of grooves 76 to a vacuum source as a semiconductor substrate that does not completely cover the grooves would not permit the formation of a vacuum between a semiconductor substrate and this upper surface 72 of the top plate 70. The inner seal 78 assists in forming a vacuum between the semiconductor substrate and the upper surface 72 of the top plate 70.

Figure 5:
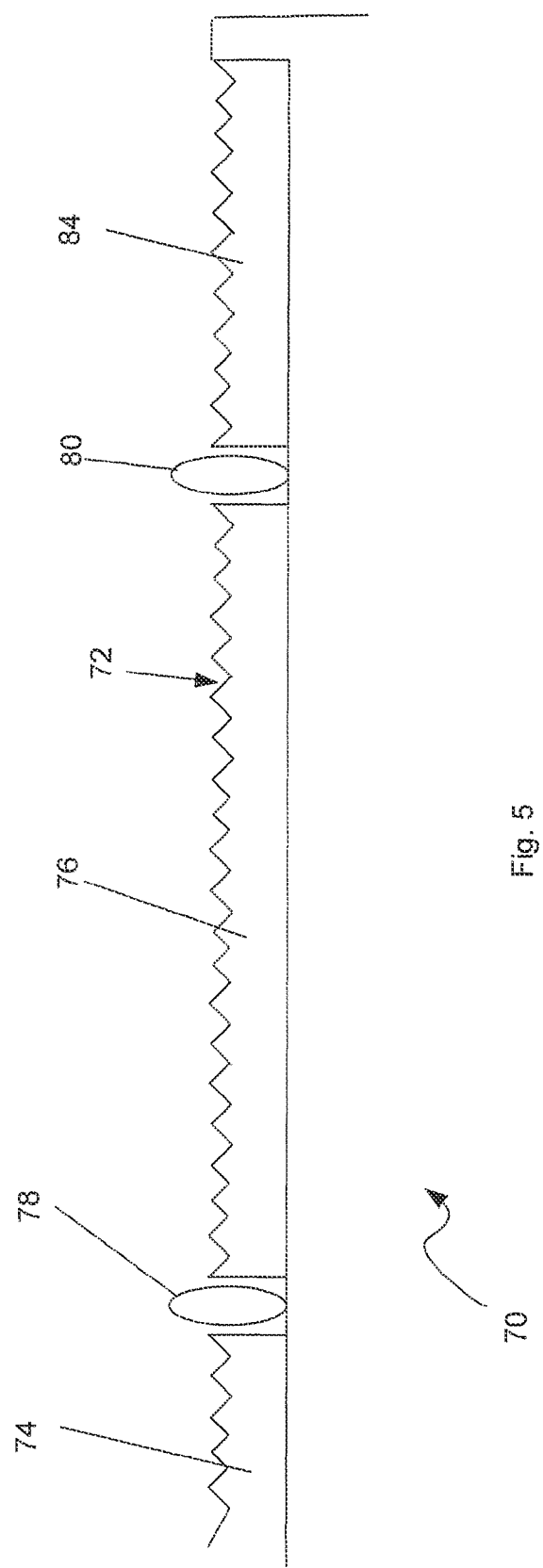
FIG. 5 is a partial schematic cross-sectional view of a top plate having an inner and outer seal.

Turning now to FIG. 5, a cross-sectional view of a top plate 70 which includes an inner seal 78 and an outer seal 80 in its upper surface 72 can be seen. Inner portion of grooves 74 and outer portion of grooves 78 are fluidicly/pneumatically coupled to a valve manifold (not shown in this figure) to selectively apply a vacuum to a semiconductor substrates placed on the upper surface 72 of the top plate 70. The seals 78, 80 are formed of elastomeric material that is minimally chemically active, resistance to the mission of particles, i.e. minimally friable, and which is resilient enough to be fully compressed to a level that is substantially the same as the upper surface 72 of the top plate 70 when a semiconductor substrate is secured thereto by action of one or both of the inner portion of grooves 74 or the outer portion of grooves 76.

Where larger semiconductor substrates are placed on the top plate 70 (e.g., if a semiconductor substrate has a diameter greater than that of the outer seal 80), it may be useful to apply vacuum to the inner and outer portions of the grooves 74, 76 sequentially, starting with the inner portion of grooves 74. In this way, the inner portion of grooves 74 apply a vacuum to the backside of a semiconductor substrate, thereby pulling that substrate downward toward contact with the upper surface 72 of the top plate 70 and also into contact with the inner seal 78. When contact with the inner seal 78 is made in whole or over a significant portion of the inner seal 78, the application of the vacuum to the backside of the semiconductor substrate is improved as the semiconductor substrate, the inner seal 78, and the inner portion of grooves 74 to form a relatively enclosed chamber which improves the efficiency of the application of the vacuum to the backside of the semiconductor substrate. Once the application of a vacuum to the backside of a semiconductor substrate over the area defined by the inner portion of grooves 74 has begun and the semiconductor substrate begins to conform to the upper surface 72 of the top plate 70, the valve manifold may be actuated, either manually or automatically by one or more of the controller's coupled thereto begin to draw an outer portion of the semiconductor substrate down into contact with the upper surface 72 of the top plate 70 over the area defined by the outer portion of grooves 76. As described above, once the underside of the semiconductor substrate approach is and begins to contact the outer seal 80, a partially closed chamber is formed between the semiconductor substrate and the upper surface 72 of the top plate 70 (being bounded by the inner and outer seal 78, 80) and the semiconductor substrate is more easily drawn into conforming contact with the upper surface 72 of the top plate.

Note that the upper surface of the top plate 70 may include an additional portion of grooves 84 that may be pneumatically connected to the valve manifold. This additional portion of grooves 84 is positioned near the periphery of the top plate 70 and the application of a vacuum to the underside of the wafer for all portions of grooves 84 may assist in fully drawing a semiconductor substrate into contact with the upper surface 72 of the top plate 70. However, as the diameter of a semiconductor substrate may not extend to fully cover the area for a portion of grooves 84, this peripheral portion of grooves is optional as the application of a vacuum to this peripheral portion of grooves 84 when it is partially uncovered may result in simply drawing on the in air into the top plate 70. In some embodiments, the outer portion of grooves 76 is plumbed together with the peripheral portion of grooves 84 such that a vacuum will be applied to both portions simultaneously.

Figure 6:
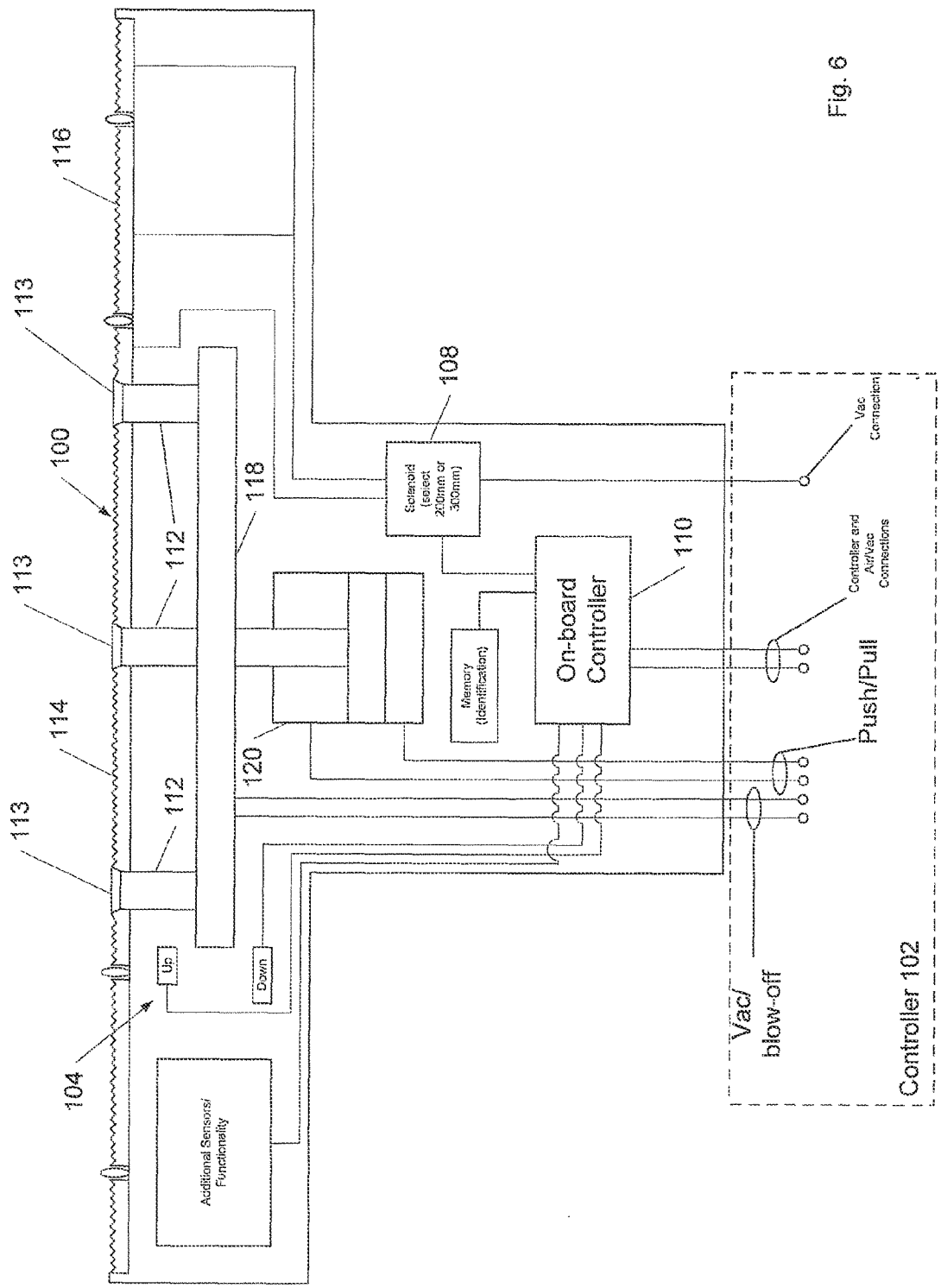
FIG. 6 is a schematic cross-sectional view of a top plate according to an embodiment of the present invention.

FIG. 6 illustrates an embodiment of the present invention in which a top plate 100 includes a local controller 102 that facilitates communication between sensors 104, 106, valve 108 and a local controller 110 that may be located within the top plate 100 itself. The local controller 110 intermediates between the sensors, the valve 108 and external pneumatic/vacuum controls located external to the top plate 100 to provide true local control of the functions of the top plate 100. The local controller 110 obtains information from the sensors 104, in this case a pair of position sensors adapted to determine the vertical position of lift pins 112. This information is used to directly control valve 108 within the top plate 100 so as to apply vacuum to the inner portion of grooves 114 and/or outer portion of grooves 116 in the upper surface of the top plate 100 as required. From a functional point of view, in some instances vacuum may be applied to the inner portion of grooves 114 before it is applied to the outer portion of grooves 116. This may be done as the lift pins 112 move downward to a retracted position in which a substrate (not shown) supported thereon is lowered onto the upper surface of the top plate 100. Only after a vacuum has been at least partially established between the substrate and the inner portion of grooves 114 will vacuum be applied to the outer portion of grooves.

Note that additional sensors may be emplaced within the top plate 100 to provide additional functionality. In some embodiments, for example, pressure sensors may be positioned to monitor the magnitude of the vacuum formed between the substrate and the respective inner and outer portions of grooves 114, 116. Where the vacuum does not meet specifications, an error message may be sent by the local controller 110 via other controllers or communications means to a user of a system who can remediate any sensed problems or errors.

In other embodiments, one or more accelerometers may be emplaced within the top plate 100 to measure the amount of vibration, acceleration to which the top plate 100 and hence a substrate supported thereon is subjected to. In some embodiments, multiple series of accelerometers may be emplaced in or on an inspection, metrology or substrate processing system such that differential analysis of accelerations/vibrations may be performed. In one embodiment, an outer chassis of an inspection system, i.e. the framework within which the stages that ultimately support a top plate and the inspection/metrology/processing mechanisms to which the top plate presents a substrate, has one or more accelerometers applied thereto to measure the amount of acceleration to which the entire system is subjected by the environment. Note that depending on the level of vibration/acceleration generated by the system itself, the aforementioned accelerometer may measure to some extent how much vibration/acceleration is output by the system in question. Additional accelerometers or vibrations sensors may be placed on the one or more stages to measure independently the acceleration/vibration to which each component is subjected. Further, where a chassis of a system includes some sort of isolation sub-frame or sub-chassis within an outer chassis accelerometers may be applied thereto as well. The idea here being that the multiple accelerometers may be used to optimize the performance of the entire system and/or to identify when the system is negatively affected by its environment and/or when the system itself generates negative effects on its environment.

For example, if large vibrations/accelerations are imposed by foot or motorized traffic adjacent to the system, the effect of such on the system at the various locations may be measured and compared to any faults or undesirable performance of the system itself. For example, the vibrations caused by moving a fork truck past a system in operation may be measured at the chassis level and subsequently at an inner- or sub-chassis or frame (if any), at the stages and/or at the top plate itself. Such differential comparison and/or correlation may identify environmental conditions that are suboptimal. Further, it is noted that mechanical systems may at times experience forms of resonance that can magnify vibration and elastic deformations of a mechanical system. Differential sensing of accelerations or vibrations may be used to optimize the "tuning" of a system and or its mechanical parts such as stages to ensure that resonance or "ringing" are minimized. Further, the actual operation of a sensor or processing mechanism may be compared or correlated with accelerations to optimize the performance of the sensor or processing tool with respect to maximal throughput. It is well known that some processes (whether inspection, metrology or direct action upon a substrate) are more sensitive to vibration or rough acceleration or vibration. Differential sensing of vibration and acceleration may be used to optimize performance as a function of throughput of the system.

Note that in some instances, a sub-frame or sub-chassis may be coupled to an outer frame or chassis by means of a damping mechanism that is intended to prevent or at least minimize the application of environmental or external vibration or acceleration to the sensors or processing mechanisms of a system. Differential analysis of acceleration between inner and outer chassis connected by damping mechanisms may provide insight into the performance of and/or the need to repair, replace, or modify the damping mechanism. Over time, data obtained from one or more system using differential analysis of acceleration may be used to assess a quality of the environment in which the one more systems operation and can be used to optimize activities within that environment such as, for example, more optimally scheduling activities within the environment or even on the one or more monitored systems to minimize undesirable environmental vibration/acceleration and to maximize system(s) performance in terms of quality and throughput.

Returning to the embodiment shown in FIG. 6, the lift pins 112 have formed on a distal end thereof a vacuum cup 113. The vacuum couples are pneumatically coupled to a vacuum/blow-off valve that is in this embodiment located external to the top plate 100. It is to be understood that where mechanical packaging constraints can be overcome, the vacuum/blow-off valve may be included in the top plate 100 itself. In any case, the vacuum cups 113 are operated by the vacuum/blow-off valve, which may be controlled entirely or in part by the local controller 110 to positively grip a substrate (not shown) that is placed on the distal ends of the lift pins 112 when the lift pins 112 are in an extended position. Subsequently, the lift pins are caused to retract by a push/pull valve which, like the vacuum/blow-off valve, is located external to the top plate 100 (but may in other embodiments be positioned within the top plate 100). The positive grip between the vacuum cups 113 of the lift pins 112 and the substrate cause the substrate to be pulled into contact with the upper surface of the top plate 100 as the lift pins are retracted. As described above, one or all of the portions of the grooves formed into the upper surface of the top plate may have a vacuum applied thereto to secure the substrate to the upper surface of the top plate 100. Note that the lift pins and the vacuum cups retract to a position in which the substrate may substantially conform to the shape of the upper surface of the top plate 100, which is in almost all embodiments flat. It is speculated that the upper surface of the top plate 100 may take other shapes where the substrate that is supported thereon requires, such as where a substrate has a non-uniform shape or where it is necessary to cause the substrate to conform to some pre-determined shape for inspection or processing needs.

The lift pins 112 may be coupled to a source of positive pressure to ensure that the substrate is released from the vacuum cups. The piston that reciprocates the lift pins may be controlled in two directions such as by the selective application of pressure to opposite sides of the piston to reciprocate the piston or the piston may be biased in a particular direction by a spring or similar device and only actively controlled in a single direction.

The position of the lift pins 112 is monitored by sensors 104 to ensure the proper operation of the top plate 100. For example, where the sensors 104 report that the lift pins are in their retracted position as shown, the local controller 110 may require that vacuum be applied to selected portions of the grooves in the top surface of the top plate 100. Conversely, the local controller 110 may stop the application of vacuum to the grooves where the lift pins are extended such that a substrate is not in contact with the top plate 100.

An additional type of sensor may note the presence or absence of a substrate in contact with the top plate 100. This sensor (not explicitly shown in FIG. 6) may provide control information to the local controller 110 and/or to external controllers that will act to prevent the lift pins from extending before the vacuum pressure applied to the grooves is equalized. This will prevent the lift pins from driving through a substrate that remains secured to the top plate 100. One such type of sensor is an infrared sensor. Other sensors such as capacitative sensor may be used as well.

Other position sensors that can be used include Inductive Non-Contact Position Sensors, String Potentiometer (also known as String Pot), Linear variable differential transformer (LVDT), Potentiometer, Capacitive transducer, Eddy-current sensors, Hall effect sensor, Proximity sensor (optical), Grating sensor, Rotary encoder (angular), linear encoder, Seismic displacement pick-up, Piezo-electric transducer, and Photodiode array.

Other sensors may detect the position and even orientation of a substrate on the top plate 100. For example, one or more linear sensors arranged radially with respect to a substrate into or on the surface of the top plate 100 may be used to detect the location of an edge of the substrate. Using these data points, the lateral positioning of the substrate may be determined and used to properly align an inspection mechanism or processing mechanism. Similarly, where the substrate is provided with some type of registration mark or feature, one or more sensors positioned in the top plate 100 may be used to sense a rotation or other orientation of the substrate with respect to the top plate 100, further improving the ability of the top plate provide alignment information to an inspection mechanism or processing mechanism. One example of this embodiment involves the placement of position sensitive sensors that can detect the presence of an edge of the substrate at a given position on the top plate at both the standard periphery of the substrate and at registration feature such as a flat or a notch in a semiconductor wafer.

Where the substrate is a semiconductor wafer made of silicon, infrared sensors may be advantageously used to determine a position of a substrate on the top plate by imaging features within the substrate though the silicon body of the substrate, i.e. by looking through the backside of the wafer. Features may be selected for their accuracy of position and/or their viewability. Suitable alignment features may be the standard fiducial marks provided by IC fabricators on a semiconductor wafer or may be a part of a functional structure of a device formed on a wafer.

In some instances it is desirable to align a substrate with respect to a top plate 100. This is done in the prior art using a pre-aligner (not shown). In some instances it may be possible to position one or more traction or lateral position mechanisms in the top plate 100 to translate and/or rotate the substrate with respect to the top plate 100. One embodiment of this feature involves the use of sensors as described above to determine a position and orientation of the substrate. This data is passed to the local controller 110 that relays this information to an external controller for the determination of what type and magnitude of translation and/or rotation is required. Where the local controller 110 is provided with sufficient processing capabilities, such alignment calculations may be done locally on the top plate 110 itself. In any case, the lift pin assembly, which can be seen to include the lift pins 112 which are coupled to a common yoke 118 which is reciprocated by a piston 120 may be allowed to have some small amount of lateral translation and rotation. For example, the yoke 118 may take the form of two plates that are only loosely coupled to one another by means of small translation actuations, such as piezoelectric actuators, that may accommodate a range of position corrections by inducing relative motion and/or rotation between the two plates. In this way, a substrate secured to the distal ends of the lift pins may be translated and/or rotated with respect to the top plate 100 to achieve an optimal alignment. Other means for translating and/or rotating a substrate with respect to the top plate 100 may also be used.

Another sensor that may be included in the top plate 100 is a thickness sensor that measures a thickness of a substrate placed on the top plate 100. One such sensor may be an infrared reflectometer. Another may be an infrared confocal sensor that includes an imaging sensor or an interferometric sensor. The use of one or more thickness sensors embedded in the top plate 100 may allow for a fast assessment of the overall thickness of a substrate and/or an assessment of the variation of thickness of the substrate. As translation of the substrate with respect to thickness sensors is not possible beyond what might be allowed for alignment purposes, it is contemplate that thickness measurements will likely be at selected points of the substrate and not over any significant portion of the surface of the substrate. In this case the thickness measurements may be used to model the geometry of the substrate based at least in part on a nominal geometric model of the substrate that is "fitted" using the obtained measurements. Alternatively, the sampled thickness data may be used in conjunction with position data concerning the upper surface of a substrate obtained by an inspection or metrology mechanism, such as for example, a laser triangulation sensor, a confocal height sensor, or a capacitative sensor.

Note that in some manufacturing settings, that is necessary to frequently exchange a top plate 100 for another that is required for handling a different substrate. For example, one top plate may be suitable for handling 300 m silicon wafers that are relatively thick, thereby not requiring ring seals and lift pins as described in conjunction with FIGS. 4-6. Accordingly, a local controller 110 may be provided with a memory module or with another identifying feature that uniquely identifies the top plate in question. This may be as simple as storing a unique serial number that may be specified in a manufactures recipes for fabrication selected types of substrates. In other instances, such as where the local controller has relatively lower capabilities, one or more resistors or a tunable potentiometer or other similar device having a unique value may be coupled to the local controller such that this identifying device may be polled by controllers external to the top plate to ensure that the proper top plate is being used in the manufacturing or inspection process or recipe.

Figure 7:
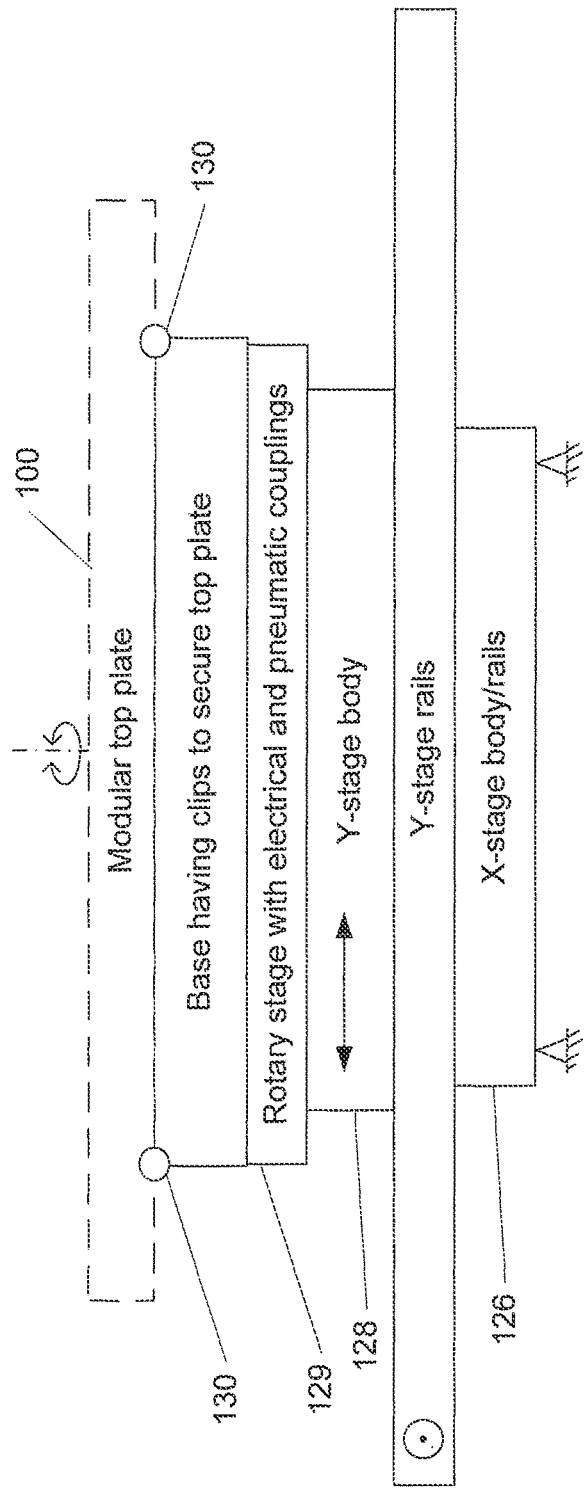
FIG. 7 is a schematic elevation view a modular semiconductor substrate support mounted upon a stage for translation in an XY plane and for rotation about an axis normal to the XY plane.

FIG. 7 shows a basic embodiment of the present invention in which an X-stage 126 is secured to a chassis or sub-chassis, as the case may be, of an inspection, metrology or processing system. A Y-stage 128 is mounted on the X-stage and it's translated in the X direction by the X-stage. The Y-stage has mounted thereon a rotary stage 129 that is translated in an XY plane defined by the translation capabilities of the X and Y stages. The rotary stage has mounted thereon a modular base having quick release clips 130 (circles) for removably coupling a top plate thereto. One novel aspect of this design is the provision of a local controller of a suitable type within the top plate 100. Another novel aspect of the present invention is the provision of sensors and/or identifying devices within the top plate that facilitate enhanced control and identification of the top plate in the context of a selected inspection or process. Another novel aspect of this design is the provision of a modular top plate interface that facilitates the connection of a top plate to vacuum, pneumatic pressure, electrical power, and to command/control circuits or networks. Yet another novel feature of this design is the use of sensors embedded in a top plate (modular or otherwise) that provide information regarding the alignment of a substrate on the top plate and/or the thickness of the substrate. Another novel aspect of the present invention involves the provision of a controller on a base plate of a Y-stage (note that the orientation of the X and Y stages may be interchanged as needed) on which the rotary stage is mounted. This controller does not rotate with the top plate on the rotary stage but communicates with sensors and/or a local controller that does rotate with the top plate by means of a rotary coupling. Note that communications between the non-rotating controller and the rotating top plate will require at a minimum one connection (as where the top plate has a separate source of power such as a battery, a capacitive power circuit, or an inductive power supply of some sort). Preferably, a non-rotating controller will have two or more electrical connections to the base of a modular top plate arrangement or to the top plate itself, one for communications and one for power. Note that ethernet connections are quite desirable in this setting and additional connections may be provided. Another novel feature of the present invention is the provision of a vacuum and pneumatic pressure control system on a non-rotating Y stage. This type of ganged control system allows for relatively local control of all vacuum and pneumatic pressure supplied to a top plate, i.e. only a single connection to outside sources need be made, thereby minimizing the number of vacuum and pneumatic connections that must be made to a translating top plate. A rotary coupling provides pathways from the ganged control system to the base of a modular top plate arrangement or to a top plate itself. Note that were package constraints are met, both the non-rotating controller and the ganged control system may be located in a base of a modular top plate assembly or in a top plate itself. The non-rotating control and a local controller that rotates with the top plate may, depending on the application, be interchangeable for one another or may form part of an extended system. Note that both rotating and non-rotating controllers are typically coupled in some way to an external controller that controls the entire inspection or processing system.

Another novel aspect of the present invention involves the placement of sensors such as accelerometers on an outer chassis of an inspection/metrology/processing system, on an inner chassis (if any) of the system, and on a top plate that supports a substrate in the inspection/metrology/processing system. Analysis of the difference in the experienced vibration/acceleration by each accelerometer may be used to optimize the performance of the system by providing information that allows for the proper tuning of the electromechanical components of the system, to identify environmental inputs that negatively affect the operation of the system, and to ensure that an optimal quality/throughput operation mode is enabled.

Figure 8:
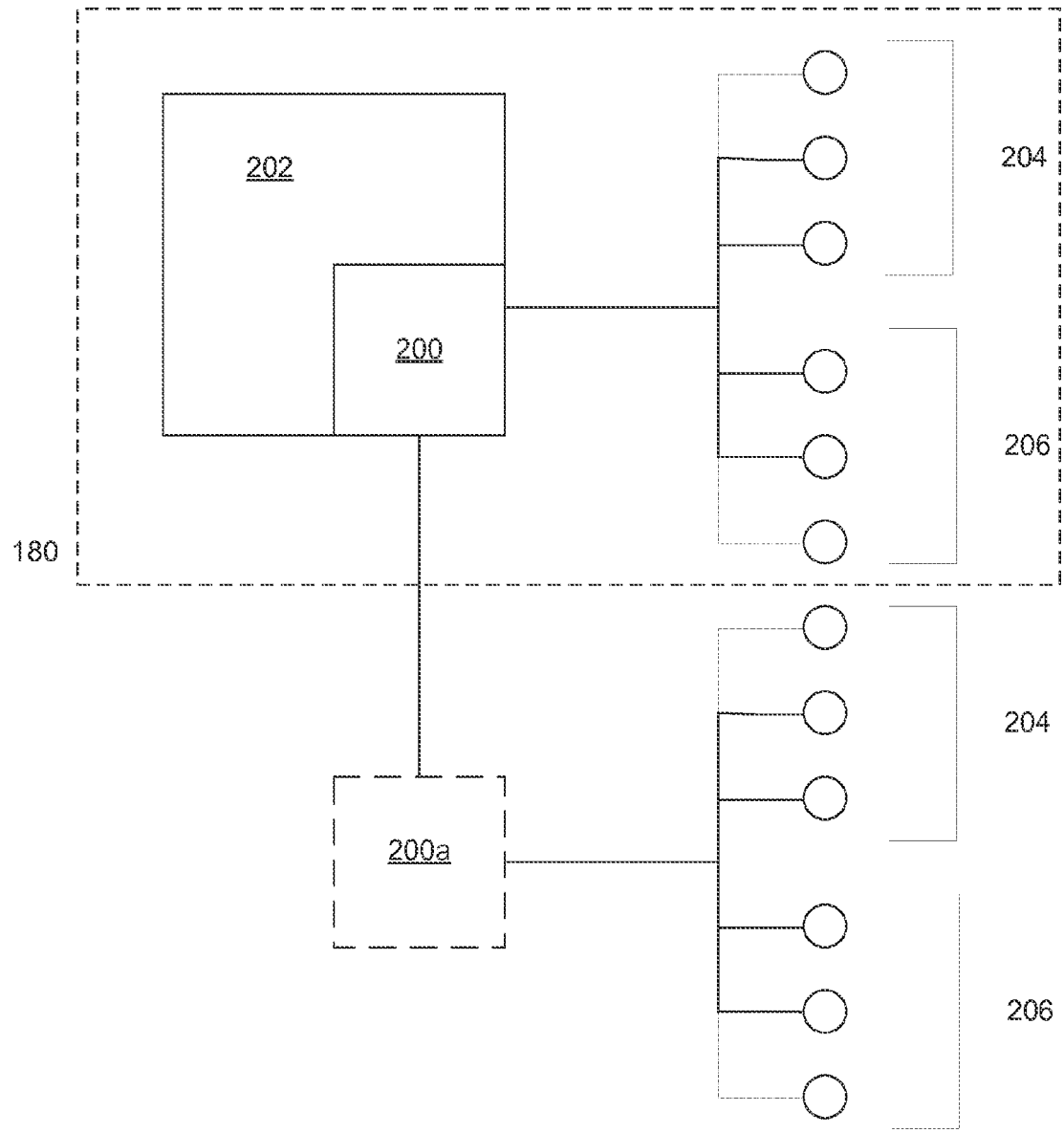
FIG. 8 is a block diagram of one embodiment of the present invention in which a controller mounted to a modular semiconductor substrate support is used to control movement of the modular semiconductor substrate support.

FIG. 8 illustrates one embodiment of the present invention in which a controller 200 positioned coupled to and moving with a modular support 202 is coupled to a number of sensors 204 and controllable devices 206. The controller 200 is adapted to implement a list of functions sometimes referred to as a recipe. The list of functions may involve movement of the modular support 200, the conversion of electronic signals from one or more sensors 204 to control signals that are provided to one or more of the controllable devices 210, communicating across a wired or wireless computer network with one or more controllers, processors, databases, or computers, and the assessment, modification, and/or creation of additional steps in the list of functions that comprise a recipe. In one embodiment the controller 200 is adapted to implement a learning based model predictive control system in which an oracle function being iterated by the controller 200 receives signals from sensors 204 and provides control signals to controllable devices 206 such that the operation of the controllable devices becomes well correlated with pre-defined set of goals.

In one implementation, data from sensors 204 such as linear and/or rotary encoders and accelerometers associated with a support 202 are collected by the controller 200. This data is indicative of not only the position of the support 202, but also of the manner in which the support 202 functions. Vibration, acceleration, velocity and position may be characterized by the output of the sensors 204. Additional information including input voltages applied to rotary and linear actuators may also be included as part of the information collected by the controller 200. In a preliminary step, the input of sensors 204 is used to establish one or more characteristics of the support 202 and its operation. Thereafter, changes to the operation of the support 202, e.g. differences in control signals applied to controllable devices 206 are applied and the resulting perturbations in the operation of the support 202 are recorded. The oracle function of the learning based model predictive control system processes input and output data to correlate actions taken by the controller 200 with the results reported by the sensors 204. In doing so, an accurate model of the operation of the support 202 is obtained. This model differs from prior control systems in that it is non-linear and yet convergent. As a result of the application of the learning based model predictive control system, the operation of the support 202 is modified to optimize for selected characteristics. In one embodiment, the learning based model predictive control system is adapted to optimize the operation of the support 202 to minimize vibration as measured by an accelerometer. In another embodiment, the learning based model predictive control system is adapted to optimize the operation of the support 202 to smooth out the acceleration profile of the support 202 as it moves along a predefined path.

In yet another embodiment, the learning based model predictive control system is adapted to optimize a pre-defined path along which the support 202 is intended to travel. The path and/or the points that define the path may be modified to optimize the rate at which the support 202 moves along the path or through the predefined set of points.

While various examples were provided above, the present invention is not limited to the specifics of the example substrate support structures and variations disclosed herein.

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A moveable semiconductor substrate support comprising:
    an XY stage for movement in an XY plane;
    a rotary stage mounted upon the XY stage, the rotary stage for rotation about an axis normal to the XY plane of motion of the XY stage;
    a top plate coupled to the rotary stage, the top plate having an upper surface nominally parallel to the XY plane of the XY stage;
    a control device emplaced within the moveable semiconductor substrate support, the control device coupled to one or more actuators in the top plate and to one or more sensors in the top plate;
    the control device receiving data from the one or more sensors and providing control signals to the one or more actuators, the control signals being based at least in part on the data obtained from the at least one sensor;
    the one or more actuators being operatively coupled to one or more substrate control mechanisms which are cycled between at least two states by the one or more actuators.

2. The moveable semiconductor substrate support of claim 1 wherein one of the substrate control mechanisms is a vacuum hold-down comprising:
    an inner seal defining a first vacuum plenum at an upper surface of the top plate;
    an outer seal defining a second vacuum plenum at an upper surface of the top plate, the second vacuum plenum being circumjacent to the first vacuum plenum.

3. The moveable semiconductor substrate support of claim 2 wherein at least one actuator is a vacuum pressure valve cycled by the control device between a first state in which vacuum pressure is applied to the first vacuum plenum and a second state in which vacuum pressure is not applied to the first vacuum plenum.

4. The moveable semiconductor substrate support of claim 2 wherein at least one actuator is a vacuum pressure valve cycled by the control device between a first state in which vacuum pressure is applied to the second vacuum plenum and a second state in which vacuum pressure is not applied to the second vacuum plenum.

5. The moveable semiconductor substrate support of claim 2 wherein at least one actuator is a single vacuum pressure valve adapted to cycle both the first and second vacuum plenums between their first and second states.

6. The moveable semiconductor substrate support of claim 2 comprising at least three vacuum plenums in the top plate.

7. The moveable semiconductor substrate support of claim 1 wherein one of the substrate control mechanisms is a set of lift pins that reciprocate with respect to the top plate between a first position in which the lift pins are fully retracted into and beneath an upper surface of the top plate and a second position in which each of the set of lift pins is extended above the surface of the top plate.

8. The moveable semiconductor substrate support of claim 7 wherein at least one actuator is cycled by the control device to move the set of lift pins between their first and second positions.

9. The moveable semiconductor substrate support of claim 7 wherein each of the set of lift pins further comprises a suction cup at a distal end of the lift pin, each suction cup being selectively coupled by at least one actuator to a source of vacuum pressure.

10. The moveable semiconductor substrate support of claim 1 wherein the control device is mounted on the XY stage and moves therewith.

11. The moveable semiconductor substrate support of claim 10 further comprising a rotary coupling for providing a supply of vacuum pressure and an electrical connection to the top plate, the supply of vacuum pressure being coupled to at least one actuator and the electrical connection being connected to the control device and to at least one actuator and to at least one sensor in the top plate.

12. The moveable semiconductor substrate support of claim 1 wherein the control device is mounted on the top plate and both moves and rotates therewith.

13. The moveable semiconductor substrate support of claim 12 further comprising a rotary coupling for providing at least a supply of vacuum pressure and an electrical connection to the top plate, the supply of vacuum pressure being coupled to at least one actuator and the electrical connection connecting the control device and to an external controller.

14. The moveable semiconductor substrate support of claim 1 wherein the top plate comprises:
 a base coupled to the rotation stage; and
 at least one support surface removably coupled to the base, the at least one support surface being adapted to support a selected semiconductor substrate.

15. The moveable semiconductor substrate support of claim 14 further comprising a first support surface having a vacuum hold-down comprising a seal defining a vacuum plenum at an upper surface of the support surface, a second support surface and an outer seal defining a second vacuum plenum at an upper surface of the top plate, the second vacuum plenum being circumjacent to the first vacuum plenum.

16. The moveable semiconductor substrate support of claim 14 wherein the control device is coupled to an identifying structure in the at least one support surface, the identifying structure providing a unique identity for each of the at least one support surfaces.

17. The moveable semiconductor substrate support of claim 14 wherein the base and the rotary stage further comprise a rotary coupling for providing at least a supply of vacuum pressure and an electrical connection to the at least one support surface.

18. The moveable semiconductor substrate support of claim 17 wherein one of the substrate control mechanisms is a vacuum hold-down comprising:
 an inner seal defining a first vacuum plenum at an upper surface of the top plate;
 an outer seal defining a second vacuum plenum at an upper surface of the top plate, the second vacuum plenum being circumjacent to the first vacuum plenum.

19. The moveable semiconductor substrate support of claim 18 wherein at least one actuator is a vacuum pressure valve cycled by the control device between a first state in which vacuum pressure is applied to the first vacuum plenum and a second state in which vacuum pressure is not applied to the first vacuum plenum.

20. The moveable semiconductor substrate support of claim 18 wherein at least one actuator is a vacuum pressure valve cycled by the control device between a first state in which vacuum pressure is applied to the second vacuum plenum and a second state in which vacuum pressure is not applied to the second vacuum plenum.

\* \* \* \* \*